(12) United States Patent
Holberg et al.

(10) Patent No.: US 6,617,934 B1
(45) Date of Patent: Sep. 9, 2003

(54) PHASE LOCKED LOOP CIRCUITS, SYSTEMS, AND METHODS

(75) Inventors: Douglas R. Holberg, Wimberley, TX (US); Sandra M. Johnson, Buda, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/283,098

(22) Filed: Mar. 31, 1999

(51) Int. Cl.[7] .......................... H03B 5/24; H03L 7/099
(52) U.S. Cl. ............................ 331/57; 331/17; 331/45
(58) Field of Search ....................... 331/8, 17, 25, 331/34, 45, 57; 327/156–159; 332/127; 360/51; 375/376; 455/260

(56) References Cited

U.S. PATENT DOCUMENTS

| | | | | |
|---|---|---|---|---|
| 5,180,994 A | * | 1/1993 | Martin et al. | 331/38 |
| 5,298,870 A | * | 3/1994 | Cytera et al. | 331/45 |
| 5,936,475 A | * | 8/1999 | Tchamov et al. | 331/57 |
| 5,945,881 A | * | 8/1999 | Lakshmikumar | 331/16 |

* cited by examiner

*Primary Examiner*—David C. Mis
(74) *Attorney, Agent, or Firm*—Steven Lin, Esq.

(57) ABSTRACT

A phase locked loop in an imaging system is used to generate signals on one of eight equal phase steps within a clock period. The phase locked loop outputs eight clock phases, or four clock phases and their complements, each running at the pixel rate, eliminating the need for higher speed circuitry. According to one embodiment, the phase locked loop employs an oscillator with three inverting stages and one non-inverting stage. The output of each stage is shifted in phase 45 degrees from the previous one, in terms of pixel clock rate. Differential stages are employed so that the delay of the inverting and non-inverting stage are the same. According to the present invention, the output of the last stage is swapped onto the input of the first stage, making it non-inverting without path delay, permitting oscillation with each stage's output remaining at 45 degrees of the previous stage's phase.

11 Claims, 13 Drawing Sheets

PLL ARCHITECTURE

PHASE LOCKED LOOP CIRCUITS, SYSTEMS, AND METHODS

CROSS REFERENCE TO RELATED APPLICATIONS

This application is related to patent application Ser. Nos. 09/282,523, 09/282,515, 09/282,524, 09/283,112, and 09/283,779, respectively entitled "Successive Approximation Calibration Apparatus, System, and Method for Dynamic Range Extender" having inventor Nadi Rafik Itani; "Amplifier System with Reducable Power" having as inventor Nadi Rafik Itani; "Preview Mode Low Resolution Output System and Method" having inventors Douglas R. Holberg, Sandra Marie Johnson, and Nadi Rafik Itani; "CCD Imager Analog Processor Systems and Methods" having inventors Douglas R. Holberg, Sandra Marie Johnson, Nadi Rafik Itani, and Argos R. Cue; "Dynamic Range Extender System and Method for Digital Image Receiver System" having inventors Sandra Marie Johnson and Nadi Rafik Itani; each of these applications filed on even date herewith, and each incorporated herein by reference in its entirety.

BACKGROUND OF THE INVENTION

This invention relates to analog and digital processors and methods, and more particularly to phase locked loop circuits, systems, and methods for charge coupled device (CCD) cameras and CMOS imagers.

1. Field of the Invention

Charge coupled device (CCD) cameras are configured to capture signals according to many different CCD output formats and pixel configurations. A certain class of CCD imagers requires 4-phase pixel timing to read out the horizontal shift register. Each of these four clocks is required to run at a predetermined pixel rate. However, the phase of each such clock with respect to the subsequent clock is shifted by 45 degrees, or ⅛ of a clock period. Currently, to generate such precise relative phases, systems use clock frequencies which are eight times the pixel rate. This results in a system requiring very high clock frequencies (e.g., 120 MHz) to accommodate the indicated phase requirements.

SUMMARY OF THE INVENTION

According to one embodiment of the present invention, a 1× phase locked loop is used to generate eight clock signals, each phase shifted from the previous one in time by ⅛th of the clock period. These eight clock signals are used to generate horizontal clocking signals on one of eight equal phase steps within a clock period. In particular, the phase locked loop outputs eight clock phases, or four clock phases and their complements, each running at the pixel rate, thereby eliminating the need for higher speed circuitry. According to one embodiment, the phase locked loop employs an oscillator with four stages, three inverting and one non-inverting. The output of each stage is shifted in phase 45 degrees from the previous one, in terms of pixel clock rate. According to one embodiment, differential stages are employed. According to one embodiment of the present invention, all of the four stages are substantially identical structures. To achieve non-inversion, the output of the last stage is connected or swapped into the input of the first stage. This results in the same delay for both inverting and non-inverting stages, permitting the ring oscillator to oscillate with each stage's output remaining at 45 degrees of the previous stage's phase.

DETAILED DESCRIPTION OF THE PREFERRED EMBODIMENTS

Figure 1:
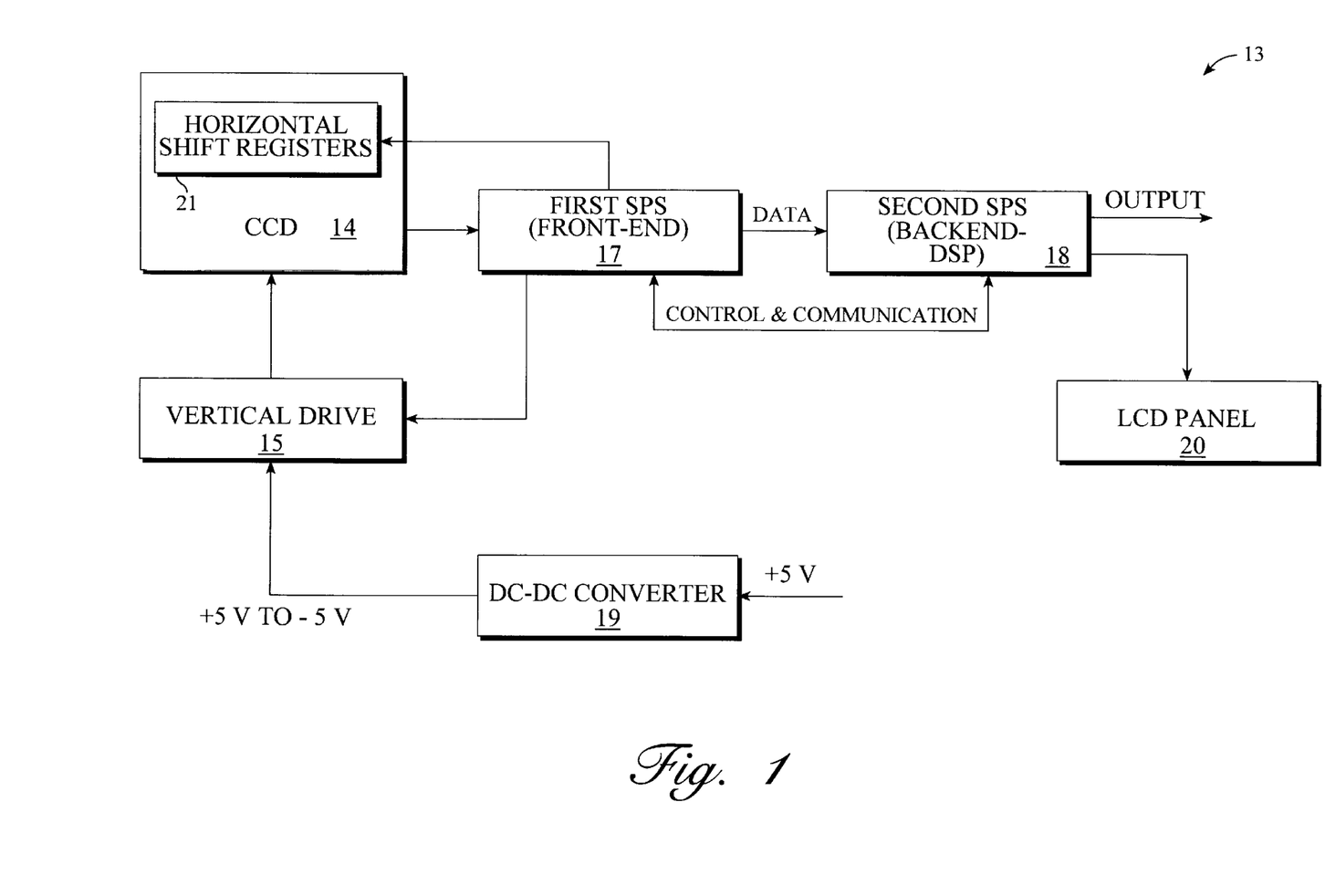
FIG. 1 is a block diagram of a CCD camera system according to the present invention.

Referring now to FIG. 1, there is shown a block diagram of a camera system 13 according to the present invention. As shown in FIG. 1, camera system 13 according to the present invention includes the following integrated circuit (IC) components, according to one embodiment of the present invention: a CCD array sensor 14, a vertical driver circuit 15 for the camera system 13, which is connected to the CCD array sensor 14. The camera system 13 further includes first and second signal processing sub-systems (SPS) 17 and 18 (i.e., a front-end and a backend subsystem), respectively the front and back end signal processing subsystems according to the present invention. The backend or second SPS 18 is implemented as a digital signal processing (DSP) chip according to one embodiment of the present invention. Front-end or first SPS 17 is connected to the CCD sensor array 14 for receipt of analog video information and to provide horizontal signals to the CCD sensor array 14, as will be discussed in greater detail below. The first SPS 17 is connected to the second SPS 18 to enable receipt of data for processing operations which are well-known in the camera and image processing fields. First and second SPS 17 and 18 are further subject to operation with well-known control and communication lines. Further, second SPS 18 provides output signals for external processing and/or evaluation by a user (not shown). Camera system 13 further includes a DC-to-DC converter 19 and a display system such as for example without limitation a liquid crystal display (LCD) panel 20. The LCD panel 20 is connected to second SPS 18 for receipt of a digital signal input. First SPS 17 is an analog signal processing (ASP) front-end (AFE) system which receives and processes video samples from the CCD array sensor 14 and generates timing clocks and pulses required by the first and second SPS 17 and 18, the CCD array sensor 14, and vertical driver circuit 15. The vertical driver circuit 15 generates high voltage vertical shift register clock signals provided to CCD array sensor 14. The video output of the CCD array sensor 14 is made through an emitter-follower and AC coupling capacitor connected to the input of the first SPS 17, according to one embodiment. The DC-to-DC converter 19 receives unregulated 5 volts DC and produces first and second regulated output voltages at 5 and −5 volts. CCD system 14 further includes a horizontal shift register 21 for controlling horizontal scanning of selected user images by CCD camera 14.

Figure 2:
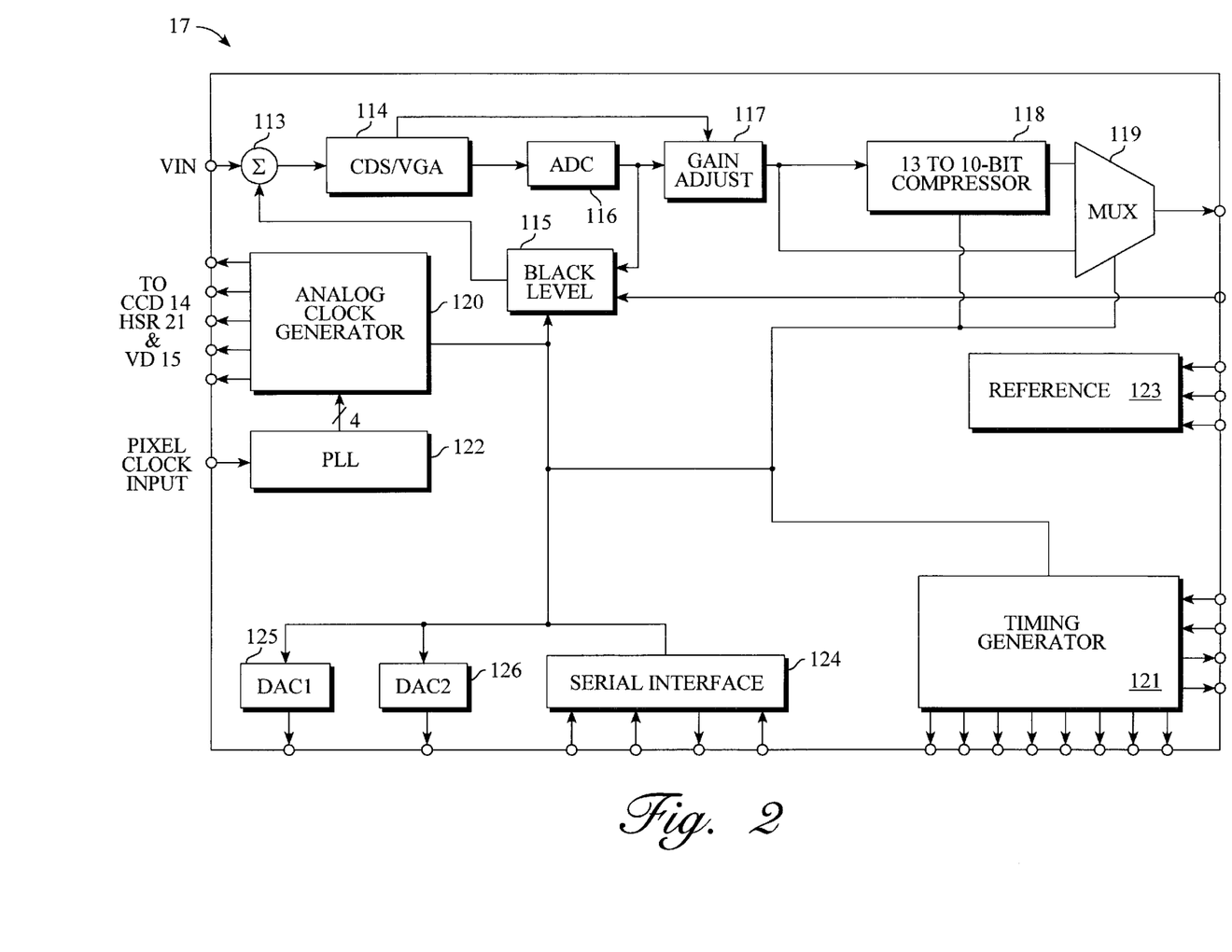
FIG. 2 is a block diagram of a signal processing (SP) system according to the present invention.

Referring now to FIG. 2, there is shown a block diagram of the first signal processing system (SPS) 17 or the front-end portion of the signal processing architecture, according to the present invention. FIG. 2 is particularly a block diagram of an analog image processor subsystem (AIPS) referred to generally as front-end in accordance with one embodiment of the present invention. First SPS 17 includes a summation node 113 and a correlated double sampler and variable gain amplifier (CDSVGA) circuit 114 receiving data in the form of an input voltage (VIN) from an image acquisition device (or imager), such as is conventionally known. First SPS 17 further includes an analog-to-digital converter (ADC) 116 connected to CDSVGA circuit 114, and a black level adjustment circuit (BLAC) 115 feeding back to the ADC 116 input via summing node 113 and CDSVGA circuit 114. First SPS 17 further includes a gain adjustment circuit 117, a 13-to-10 bit compressor circuit 118, and a multiplexer circuit 119 for permitting selection of outputs between the compressor circuit 118 and gain adjustment circuit 117, according to one embodiment of the present invention. Gain adjustment circuit 117 is connected at its input to ADC 116 and at its output to compressor circuit 118. SPS 17 additionally includes an analog clock generator circuit 120, a timing generator circuit 121, a phase locked loop (PLL) circuit 122, a reference circuit 123, a serial interface circuit 124, and first and second digital-to-analog converters 125 and 126. Gain adjustment circuit 117 is controlled by CDSVGA circuit 114. PLL circuit 122 receives input pixel clock pulses and contributes to control of analog clock generator circuit 120, which in turn produces signals to CCD 14, to horizontal shift registers 21, and to vertical drive 15. Timing generator circuit 121 provides timing signals to external circuitry (not shown). Serial interface 124 is connected for communication with black level circuit 115, analog clock generator 120, DAC1, DAC2, timing generator 121, compressor 118, and output multiplexer 119.

Figure 3:
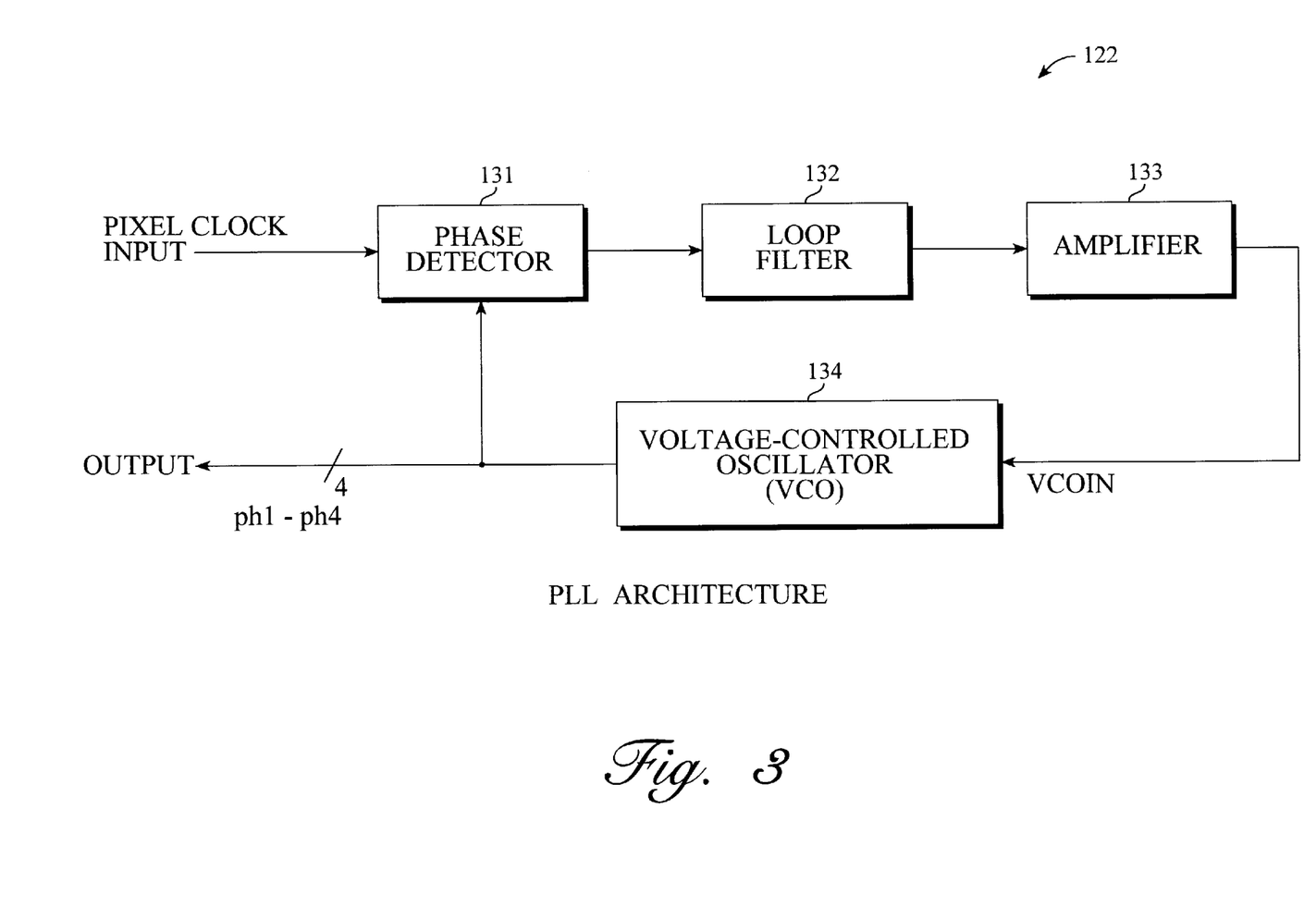
FIG. 3 is a block diagram of a phase locked loop (PLL) circuit according to one architectural embodiment of the present invention.

Referring now to FIG. 3, there is shown a block diagram of a phase locked loop (PLL) circuit 122 according to one architectural embodiment of the present invention. In particular, PLL circuit 122 includes a phase detector circuit 131, a loop filter circuit 132, an amplifier circuit 133, and a voltage-controlled oscillator circuit (VCO) 134 according to one embodiment of the present invention. The phase detector 131 receives a pixel clock input signal and produces a first output signal which is provided to loop filter 132. The loop filter in turn produces a second output signal which is provided to amplifier circuit 133 for amplification. The amplifier circuit 133 in turn provides a VCOIN signal which is provided to the VCO circuit 134 to enable production of a group of PLL output signals on four parallel signal lines carrying signals ph1–ph4, which are provided to analog clock generator 120 to drive CCD 14. One PLL output signal is further provided to phase detector circuit 131 as a feedback signal.

Figure 4:
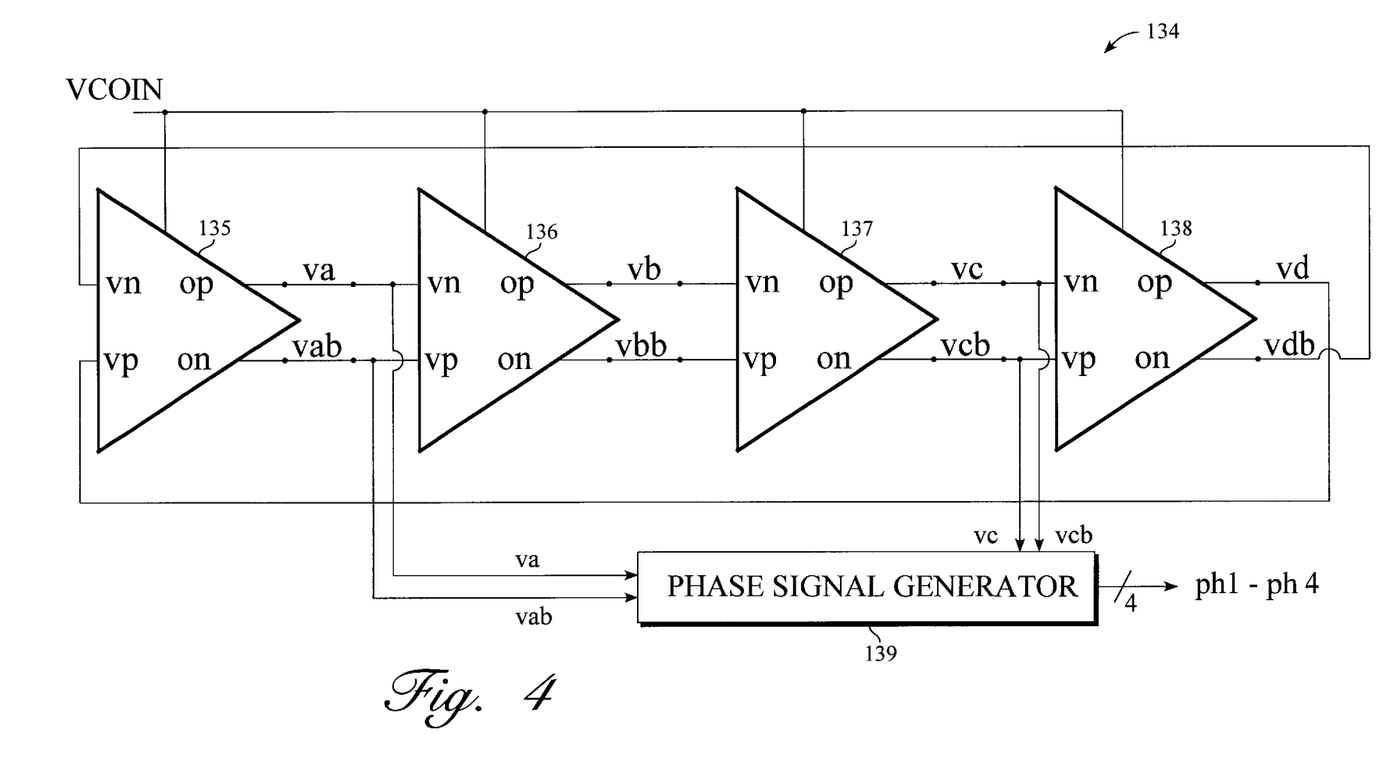
FIG. 4 is a circuit diagram of a voltage-controlled oscillator (VCO) circuit according to one embodiment of the present invention.

Referring now to FIG. 4, there is shown a block diagram of a voltage-controlled oscillator (VCO) circuit 134 according to one embodiment of the present invention. In particular, according to one version of the invention, VCO circuit 134 includes a differential ring oscillator including first through fourth differential stages respectively 135–138, and a phase signal generator 139. The ring oscillator provides output signals va, vab, vc, and vcb to phase signal generator 139. The phase signal generator 139 provides PLL output signals to phase detector circuit 131 and signals ph1–ph4 to analog clock generator 120. Each of differential stages 135–138 has input connections vn and vp and output connections op and on. Additionally, each of the differential stages 135–138 has an input connection for VCOIN to enable adjustment of the output signal frequency. According to the present invention, the VCO circuit 134 follows the indicated relationships:

vn135 is connected to on138;
vp135 is connected to op138;
vn136 is connected to op135;
vp136 is connected to on135;
vn137 is connected to op136;
vp137 is connected to on136;
vn138 is connected to op137; and
vp138 is connected to on137.

Additionally, the oscillator runs at twice the PLL input frequency, according to one embodiment of the present invention.

Figure 5:
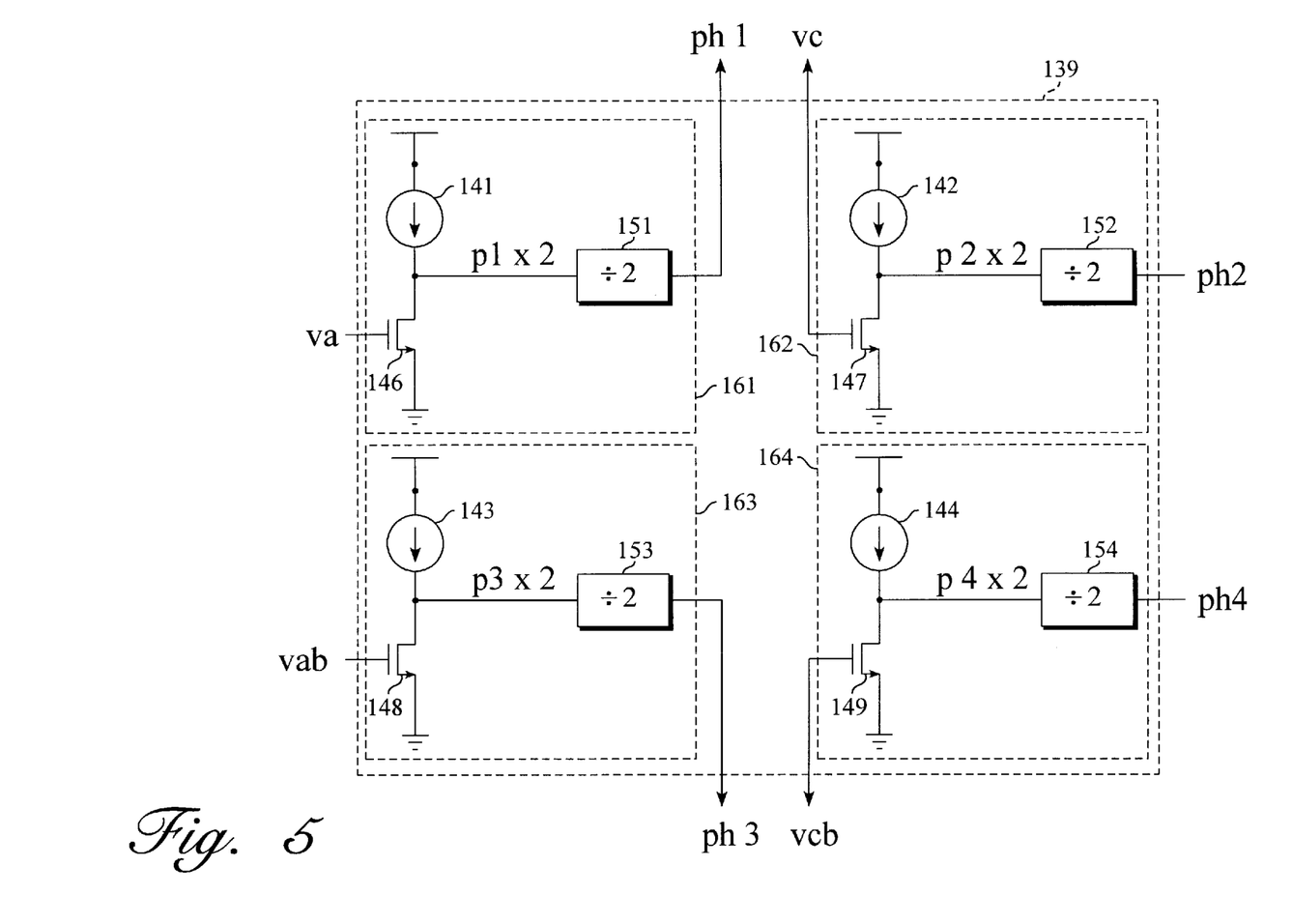
FIG. 5 is a circuit diagram of a phase signal generator according to one embodiment of the present invention.

Referring now to FIG. 5, there is shown a circuit diagram of a phase signal generator 139 according to one embodiment of the present invention. In particular, phase signal generator includes first through fourth current sources 141–144; first through fourth transistors 146–149; and first through fourth divide-by-two frequency dividers 151–154. Phase signal generator 139 particularly includes first through fourth signal generation subcircuits respectively 161–164. First signal generation subcircuit 161 includes first current source 141, first transistor 146, and first divide-by-two frequency divider 151. Second signal generation subcircuit 162 includes second current source 142, second transistor 147, and second divide-by-two frequency divider 152. Third signal generation subcircuit 163 includes third current source 143, third transistor 148, and third divide-by-two frequency divider 153. Fourth signal generation subcircuit 164 includes fourth current source 144, fourth transistor 149, and fourth divide-by-two frequency divider 154. First current source 141 provides current to first transistor 146 which is controlled by signal va, and divide-by-two frequency divider 151 is connected to first current source 141 and first transistor 146, to produce output signal ph1. Second current source 142 provides current to second transistor 147 which is controlled by signal vc, and divide-by-two frequency divider 152 is connected to second current source 142 and second transistor 147, to produce output signal ph2. Third current source 143 provides current to third transistor 148 which is controlled by signal vab, and divide-by-two frequency divider 153 is connected to third current source 143 and third transistor 148, to produce output signal ph3. Fourth current source 144 provides current to fourth transistor 149 which is controlled by signal vcb, and divide-by-two frequency divider 154 is connected to fourth current source 144 and fourth transistor 149, to produce output signal ph4. As a result, phase signal generator circuit 139 operates as a buffer to full-scale voltage and is effective to divide the output clock frequency back to the same frequency as the PLL input clock.

Figure 6A:
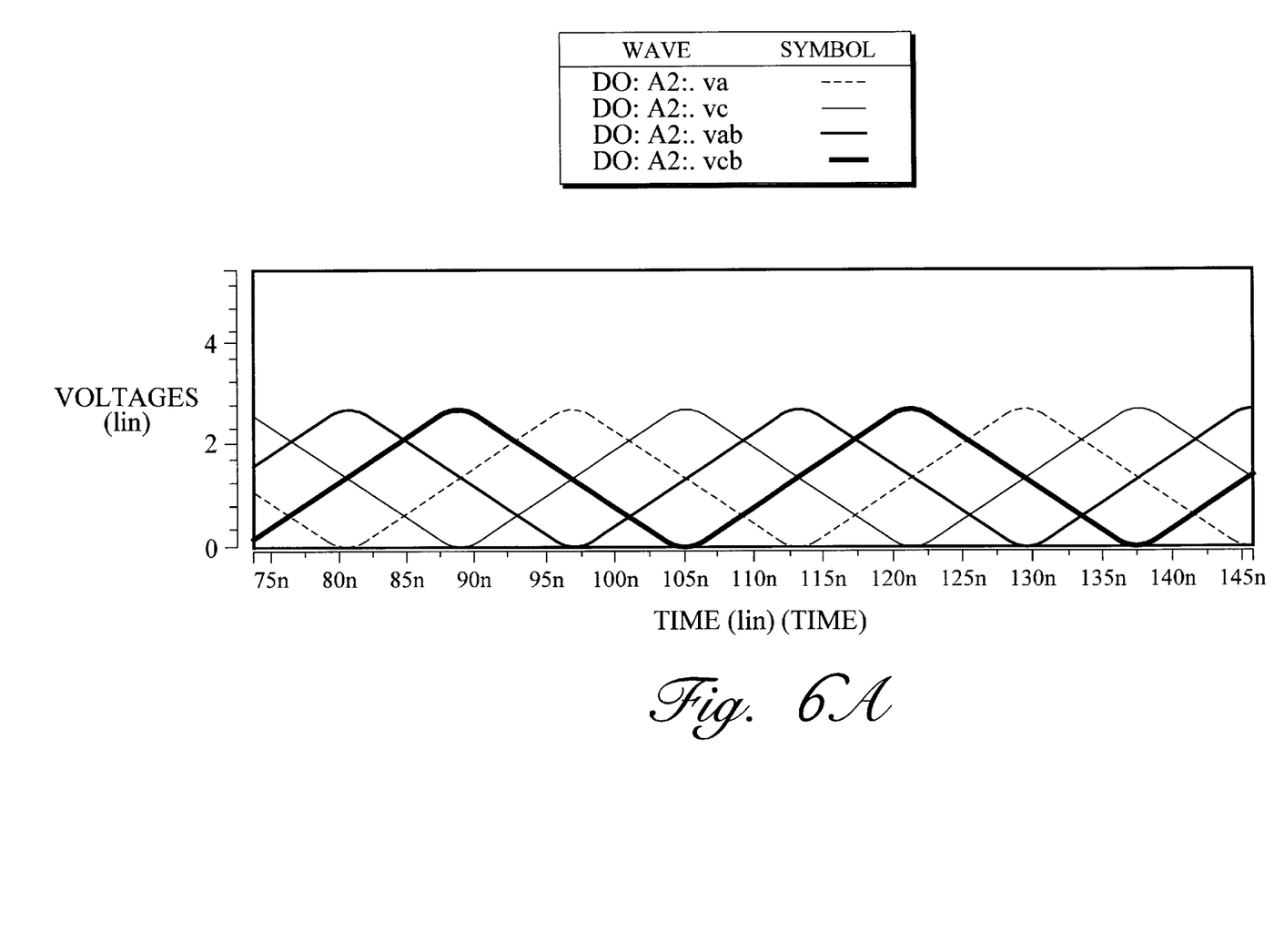
FIGS. 6A–6C are waveform diagrams of operation of a multistage voltage-controlled oscillator (VCO) circuit according to one embodiment of the present, with FIG. 6A showing first through fourth input VCO waveforms which are out of phase with respect to each other by predetermined amounts, FIG. 6B showing first through fourth phase signal generator internal waveforms which are out of phase with respect to each other by predetermined amounts, and FIG. 6C showing first through fourth PLL output waveforms ph1–ph4, which are out of phase with respect to each other by predetermined amounts.
Figure 6B:
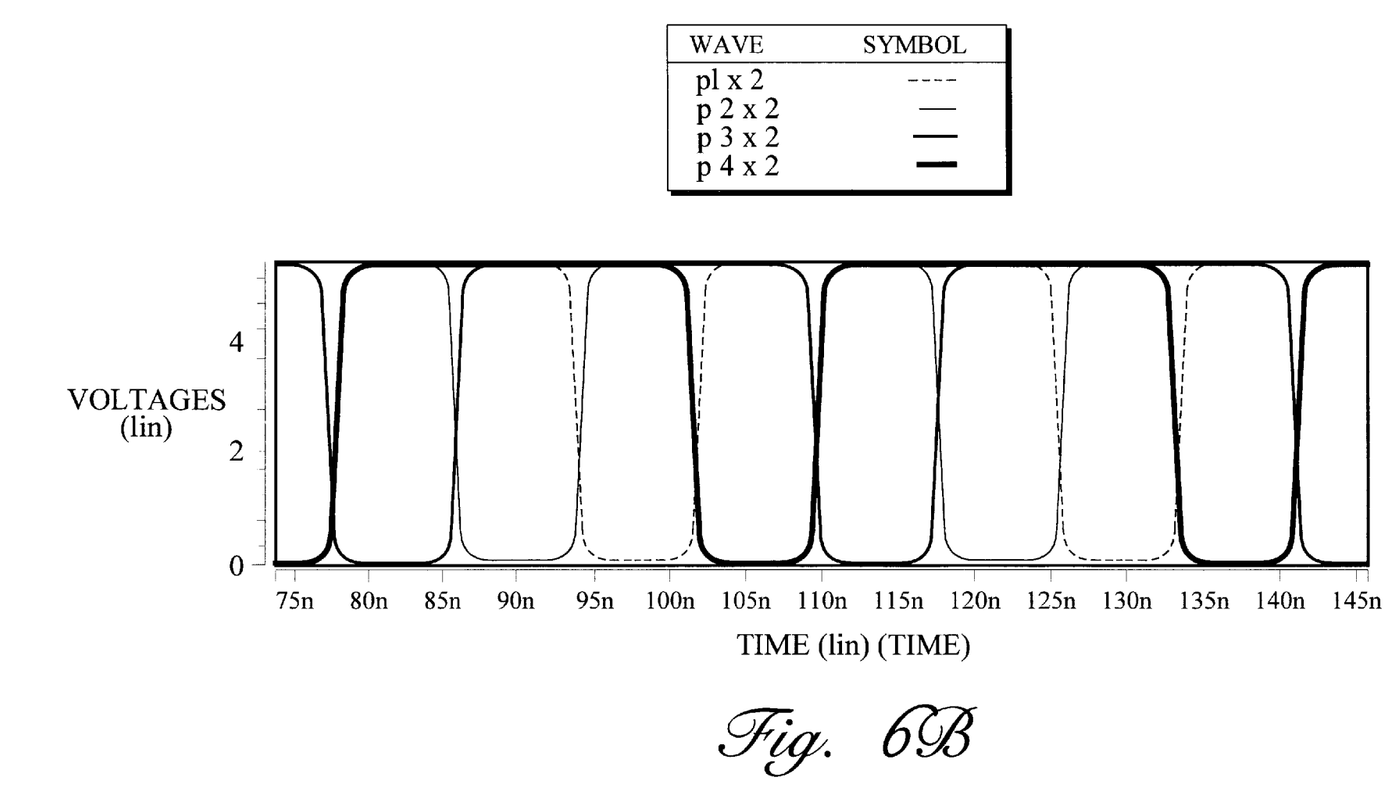
Figure 6C:
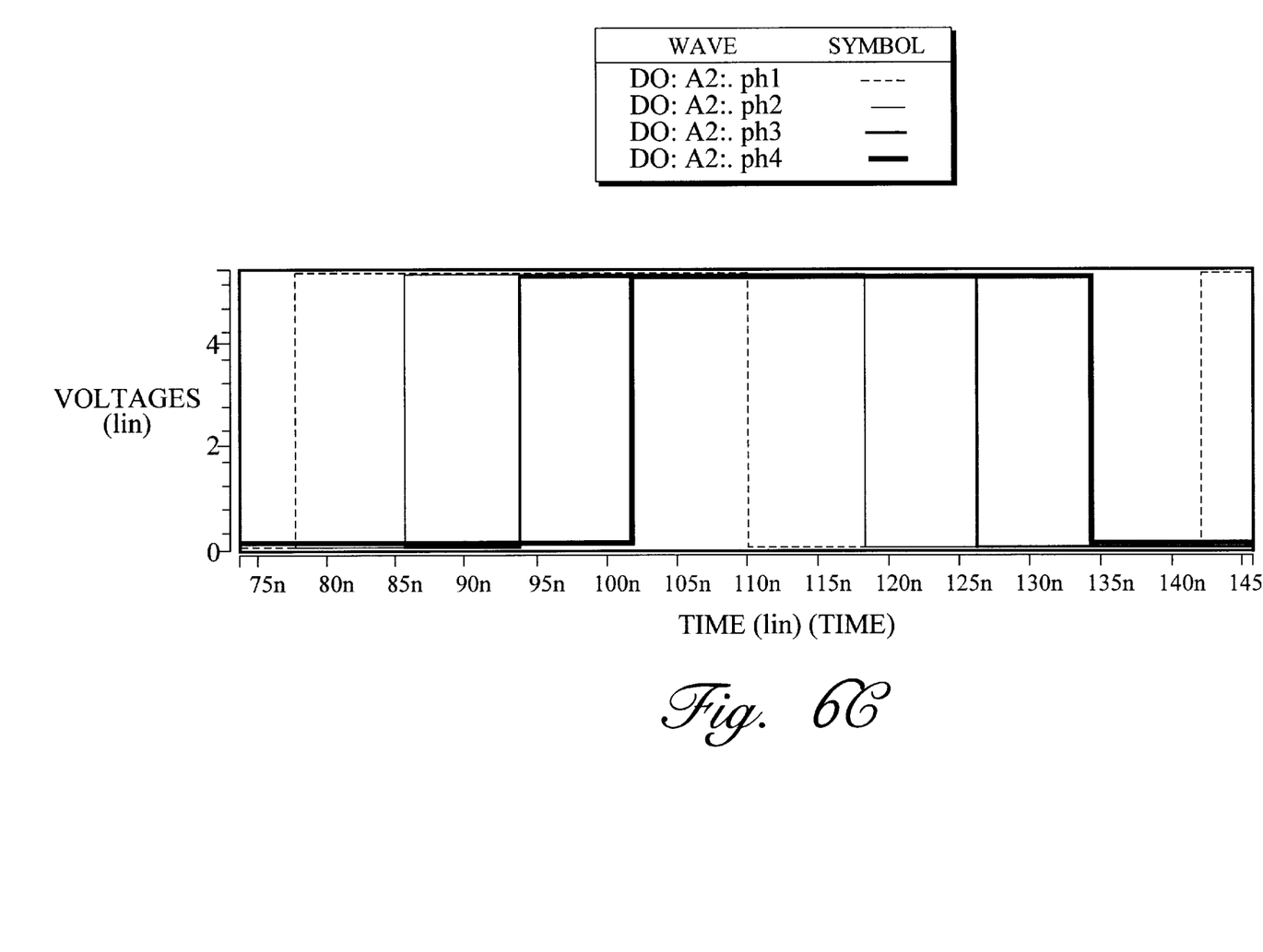

Referring now to FIGS. 6A–6C, there are shown waveform diagrams of operation of a multistage voltage-controlled oscillator (VCO) circuit according to one embodiment of the present invention. In particular, FIG. 6A shows first through fourth ring oscillator output waveforms which are out of phase with respect to each other by predetermined amounts. FIG. 6B shows first through fourth phase signal generator internal waveforms which are out of phase with respect to each other by predetermined amounts. The indicated waveforms are subject to frequency division within phase signal generator 139 for production of PLL output waveforms in accordance with the present invention. FIG. 6C shows first through fourth PLL output waveforms ph1–ph4, which are out of phase with respect to each other by predetermined amounts.

Figure 7:
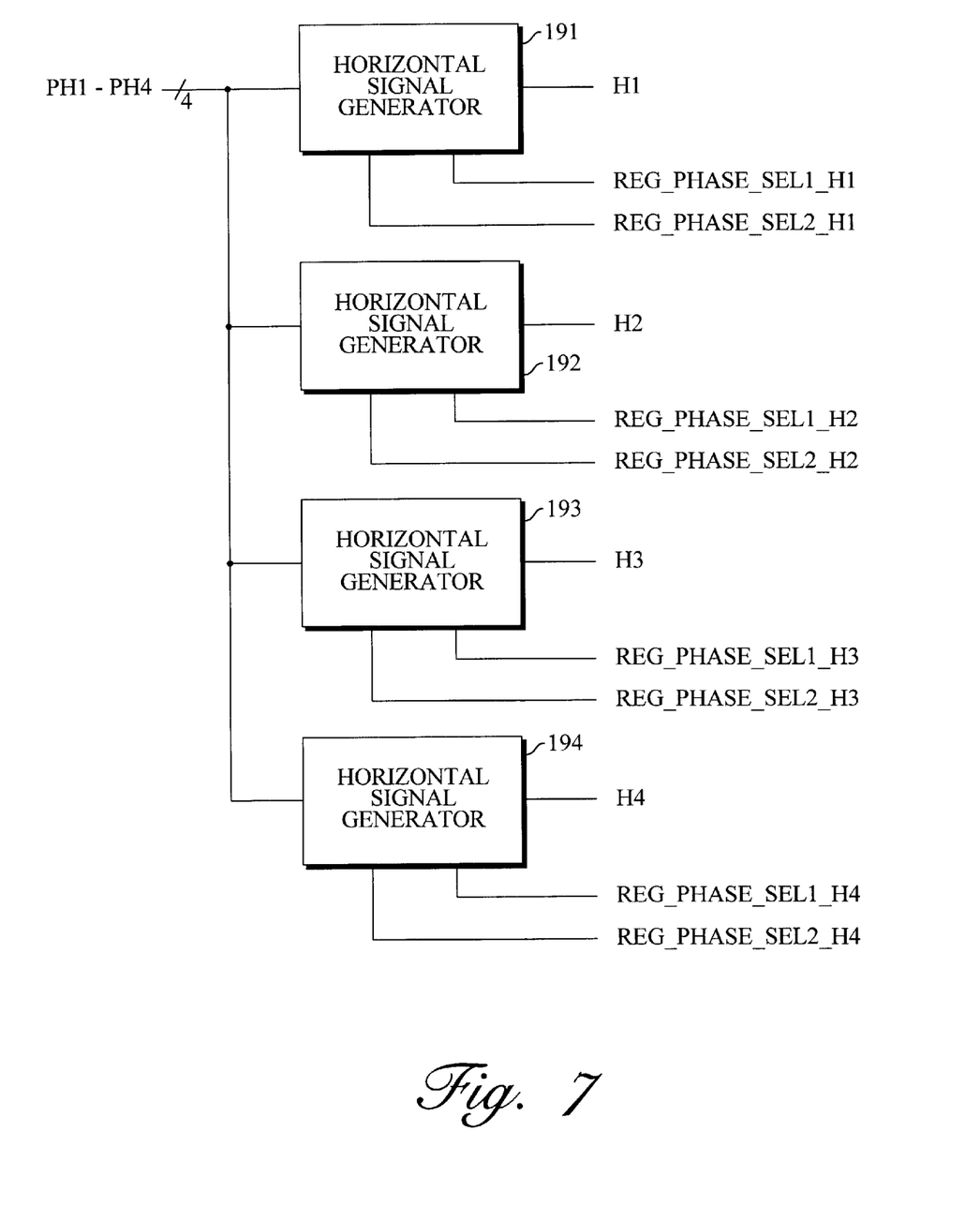
FIG. 7 is a block diagram of selected portions of an analog clock generator 120 according to one embodiment of the present invention.

Referring now to FIG. 7, there is shown a block diagram of selected portions of an analog clock generator 120 according to one embodiment of the present invention. In particular, the indicated portions of analog clock generator 120 include first through fourth horizontal signal generator circuits respectively 191–194 for producing the horizontal shift register clock signals, H1–H4. Each of the horizontal signal generator circuits 191–194 receives as input information signals ph1–ph4 from phase signal generator 139. Further, horizontal signal generator 191 produces an output signal H1 in response to input selection signals REG_PHASE_SEL1_H1 and REG_PHASE_SEL2_H1. Horizontal signal generator 192 produces an output signal H2 in response to input selection signals REG_PHASE_SEL1_H2 and REG_PHASE_SEL2_H2. Additionally, horizontal signal generator 193 produces an output signal H3 in response to input selection signals REG_PHASE_SEL1_H3 and REG_PHASE_SEL2_H3. Finally, horizontal signal generator 194 produces an output signal H4 in response to input selection signals REG_PHASE_SEL1_H4 and REG_PHASE_SEL2_H4. The signals REG_PHASE_SEL1_H1, REG_PHASE_SEL2_H1, REG_PHASE_SEL1_H2, REG_PHASE_SEL2_H2, REG_PHASE_SEL1_H3, REG_PHASE_SEL2_H3, REG_PHASE_SEL1_H4, and REG_PHASE_SEL2_H4 are 3-bit signals set by programmable registers accessed by the serial interface.

Figure 8:
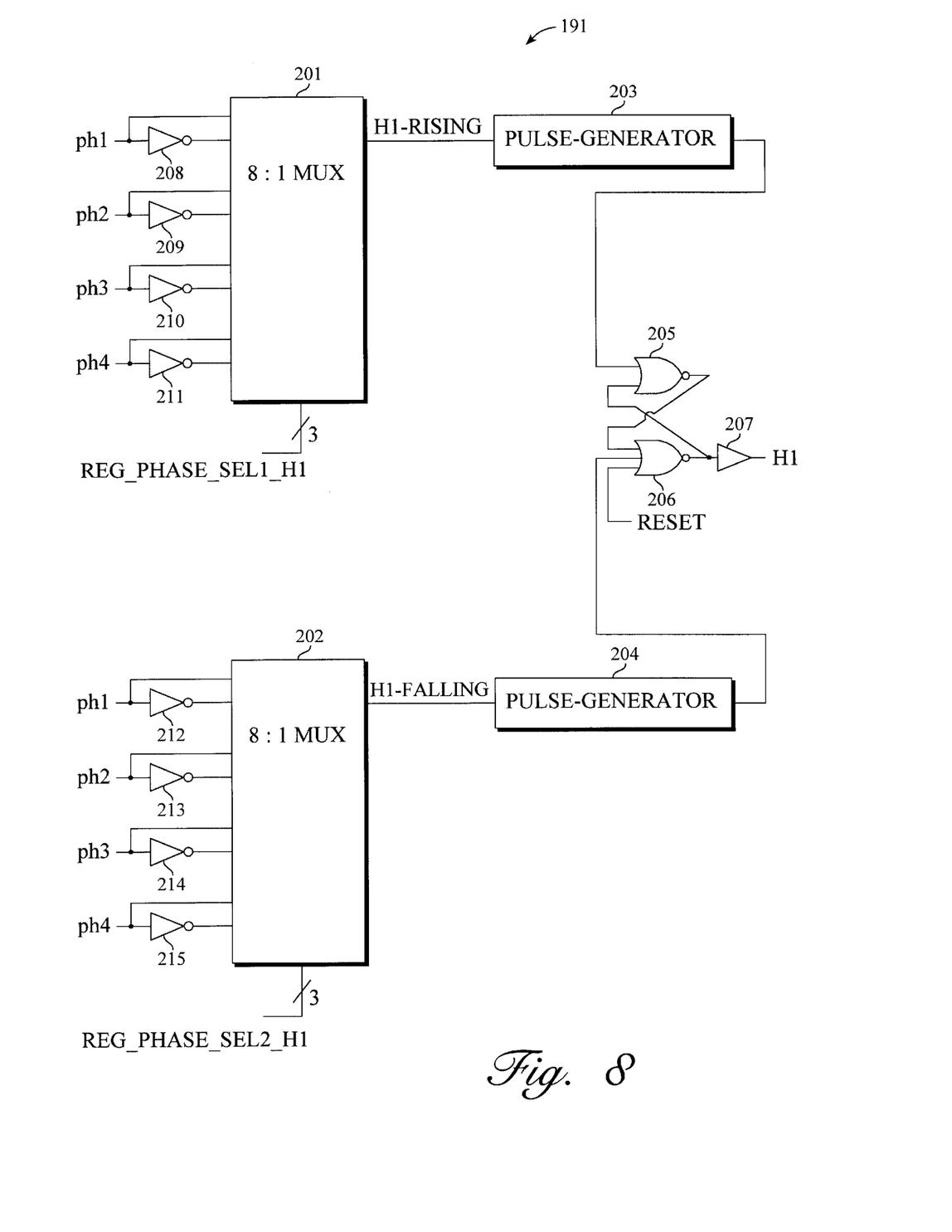
FIG. 8 is a block diagram of an H-signal generation (HSG) circuit according to an embodiment of the present invention.

Referring now to FIG. 8, there is shown a block diagram of horizontal-signal generation (HSG) circuit 191 according to an embodiment of the present invention. In particular, HSG circuit 191 includes first and second 8:1 multiplexers 201 and 202, first and second pulse-generators 203 and 204, first and second NOR gates 205 and 206, buffer 207, and inverters 208–215. MUX 201 is provided with input signals ph1–ph4 and the inversions of these signals at the outputs of inverters 208–211, subject to selection by signal REG_PHASE_SEL1_H1. MUX 202 is provided with input signals ph1–ph4 and the inversions of these signals at the outputs of inverters 212–215, subject to selection by signal REG_PHASE_SEL2_H1. The output signal from MUX 201, H1_RISING, is provided to pulse generator 203, and the output of pulse generator 203 is provided to NOR gate 205. The output signal from MUX 202, H1_FALLING, is provided to pulse generator 204, and the output of pulse generator 204 is provided to NOR gate 206. NOR gates 205 and 206 are cross-coupled, so that the output of NOR gate 206 is an input to NOR gate 205, and so that the output of NOR gate 205 is an input to NOR gate 206. Further, the output of NOR gate 206 is provided to the input of buffer 207, which in turn produces output signal H1.

Figure 9:
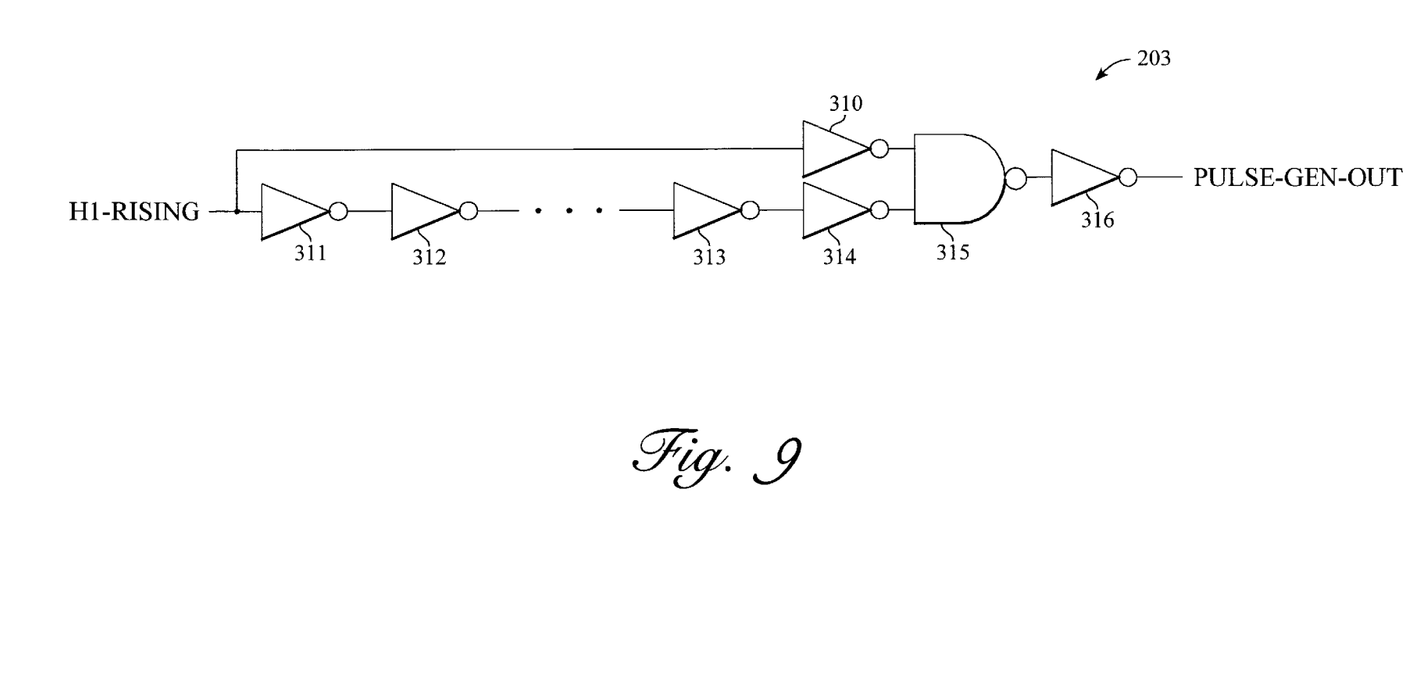
FIG. 9 is a block diagram of a pulse generator according to an embodiment of the present invention.

Referring now to FIG. 9, there is shown a block diagram of a pulse generator 203, 204 according to an embodiment of the present invention. According to one embodiment of the present invention, each of pulse generators 203 and 204 is constructed according to the same components and architecture. The construction of pulse generator 203 for example includes a plurality of inverters 310–314, a NAND gate 315, and an output inverter 316. The input signal H1_RISING is provided to inverters 310 and 311, and through inverter 311 to inverters 312–314 which are connected to each other in succession. Inverters 311–314 are series connected, and any even number of selected series inverters can be so connected, depending upon the pulse width desired. Inverters 310 and 314 are connected to the respective inputs of NAND gate 315, and the output of NAND gate 315 is connected to inverter 316 which produces an output signal PULSE_GEN_OUT, for provision to NOR gate 205.

Figure 10:
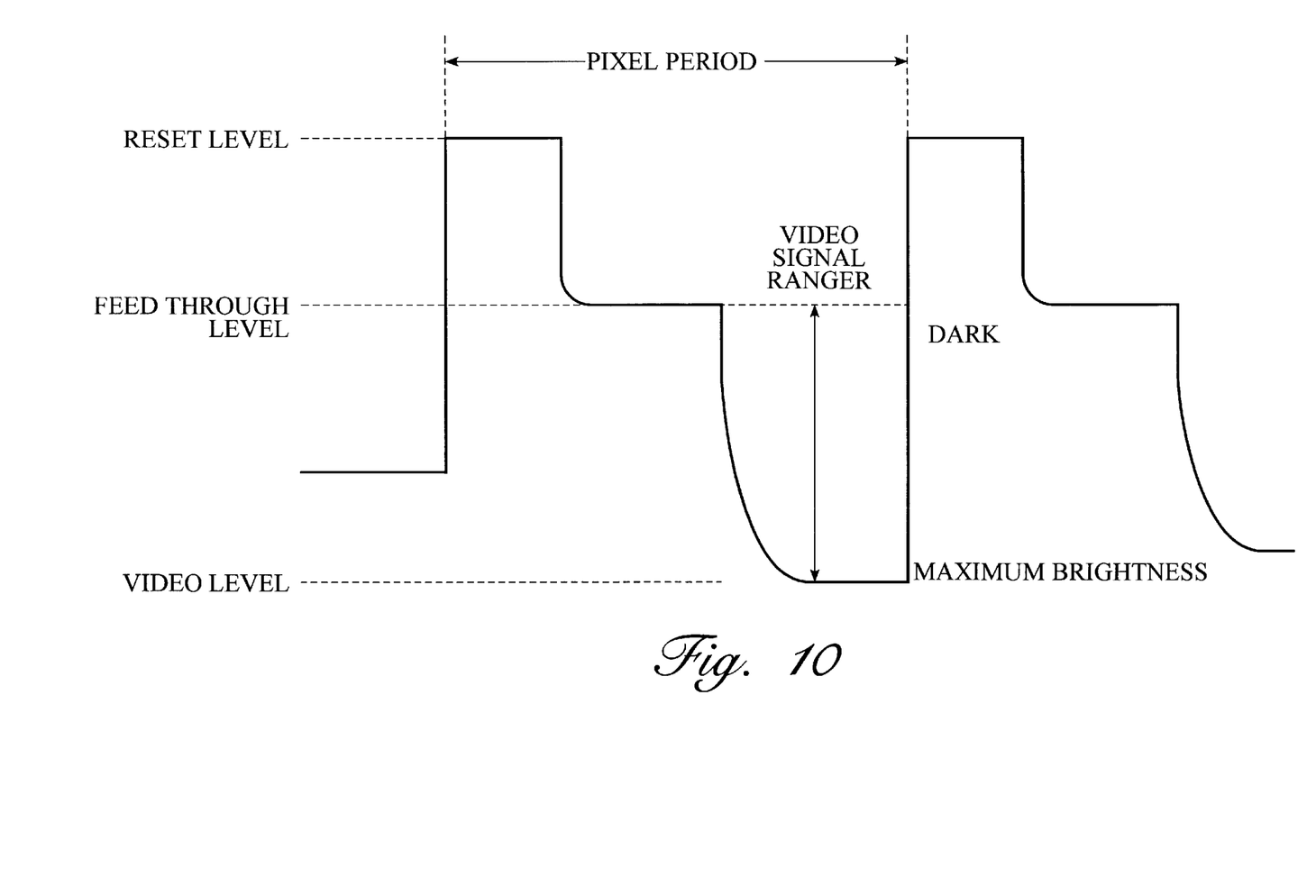
FIG. 10 is a diagram of a common output waveform of a selected imager, which is processed in accordance with one embodiment of the present invention.

Referring now to FIG. 10, there is shown a diagram of a common output waveform of a selected imager, which is processed in accordance with one embodiment of the present invention. In particular, there is shown a diagram of a common output waveform of a selected imager used in connection with the present invention.

Figure 11:
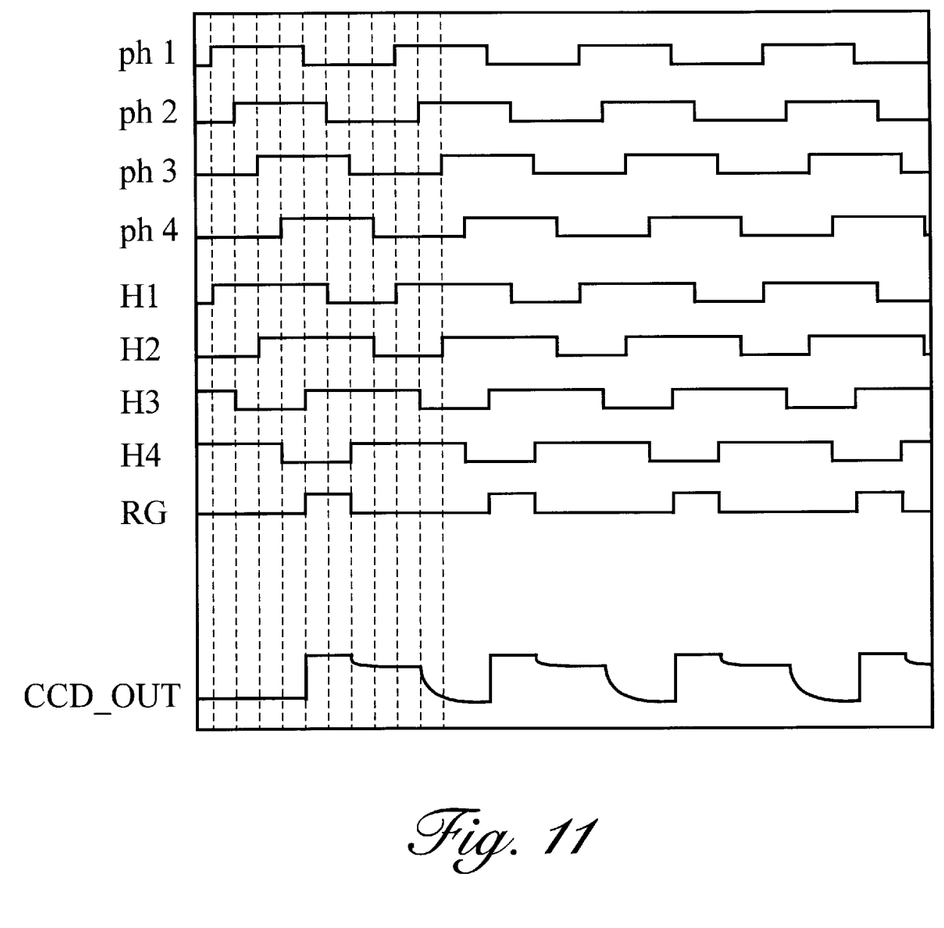
FIG. 11 is a timing diagram of horizontal clock timing according to one embodiment of the present invention.

Referring now to FIG. 11, there is shown a timing diagram of horizontal clock timing according to one embodiment of the present invention. In particular, the timing diagram shows the clock signals ph1–ph4 and H1–H4, in relationship with signals RG and CCD_OUT. As is shown in FIG. 7, the signals H1–H4 are produced from signals ph1–ph4. Accordingly, this diagram results in the settings for the REG_PHASE_SEL1_Hx and 2_Hx signals in FIG. 7 as shown in the following table:

| Horizontal Clock | Edge | Default Value |
|---|---|---|
| H1 | rising | ph1 |
| H1 | falling | ph2bar |
| H2 | rising | ph3 |
| H2 | falling | ph4bar |
| H3 | rising | ph1bar |
| H3 | falling | ph2 |
| H4 | rising | ph3bar |
| H4 | falling | ph4 |

What is claimed is:

1. A phase locked loop circuit for generating eight substantially equally phase-stepped clock signal edges for a charge coupled device (CCD) per clock period, said phase locked circuit comprising:

a phase detector for receiving a CCD signal;

a loop filter connected to the phase detector;

an amplifier circuit connected to the loop filter; and a voltage-controlled oscillator connected to said amplifier circuit and said phase detector, wherein said voltage-controlled oscillator includes an even plurality of series connected stages each having first and second inputs, first and second outputs, and a control input terminal, said series connected stages being configured to produce substantially equally phase-stepped output clock signals.

2. The phase locked loop circuit according to claim 1, wherein each substantially equally phase-stepped output clock signal edge is approximately forty-five (45) degrees from at least one other substantially equally phase-stepped output clock signal edge.

3. The phase locked loop circuit according to claim 1, further comprising means for producing signals used by the horizontal signal generator which produces signals for the horizontal shift registers in a charge coupled device.

4. The phase locked loop circuit according to claim 1, further comprising a phase signal generator having first through fourth phase signal generator inputs and first through fourth phase signal generator outputs.

5. The phase locked loop circuit according to claim 1, wherein said control input terminals are electrically connected to each other.

6. The phase locked loop circuit according to claim 1, wherein said phase signal generator is connected to the outputs of said first stage and the outputs of said third stage.

7. The phase locked loop circuit according to claim 1, wherein said phase signal generator includes first through fourth phase signal generator subcircuits configured for frequency division.

8. The phase locked loop circuit according to claim 6, wherein each of said first through fourth phase signal generator subcircuits includes a current source, a transistor, and a frequency division circuit connected to said current source and said transistor.

9. The phase locked loop circuit according to claim 8, wherein said control input terminals are electrically connected to each other.

10. A voltage-controlled oscillator comprising:

an even plurality of series connected stages each having first and second inputs, first and second outputs, and a control input terminal; and a phase signal generator having first through fourth phase signal generator inputs and first through fourth phase signal generator outputs.

11. The phase locked loop circuit according to claim 10, wherein said phase signal generator is connected to the outputs of said first stage and the outputs of said third stage.

* * * * *